(12) United States Patent
Cho et al.

(10) Patent No.: US 7,276,786 B2
(45) Date of Patent: Oct. 2, 2007

(54) STACKED BOARD-ON-CHIP PACKAGE HAVING MIRRORING STRUCTURE AND DUAL INLINE MEMORY MODULE ON WHICH THE STACKED BOARD-ON-CHIP PACKAGES ARE MOUNTED

(75) Inventors: Jeong-Hyeon Cho, Gyeonggi-do (KR); Jung-Joon Lee, Seoul (KR); Do-Hyung Kim, Seoul (KR); Byung-Se So, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 11/177,736

(22) Filed: Jul. 8, 2005

(65) Prior Publication Data

US 2006/0055017 A1    Mar. 16, 2006

(30) Foreign Application Priority Data

Sep. 10, 2004    (KR) ............... 10-2004-0072471

(51) Int. Cl.
*H01L 23/42* (2006.01)
*H01L 23/58* (2006.01)
*H01L 29/40* (2006.01)

(52) U.S. Cl. ............... 257/686; 257/777; 257/723; 257/784; 257/774; 257/713; 257/E23.085

(58) Field of Classification Search ............... 257/686, 257/784, 774, 707, 713, 723, 777, 774.7
See application file for complete search history.

(56) References Cited

U.S. PATENT DOCUMENTS

| | | | | |
|---|---|---|---|---|
| 5,798,564 A | * | 8/1998 | Eng et al. | ............... 257/686 |
| 6,101,100 A | * | 8/2000 | Londa | ............... 361/761 |
| 6,388,333 B1 | | 5/2002 | Taniguchi et al. | |
| 6,403,398 B2 | | 6/2002 | Ohuchi et al. | |
| 6,489,676 B2 | | 12/2002 | Taniguchi et al. | |
| 6,577,013 B1 | * | 6/2003 | Glenn et al. | ............... 257/777 |
| 2005/0224955 A1 | * | 10/2005 | Desai et al. | ............... 257/706 |

FOREIGN PATENT DOCUMENTS

| | | |
|---|---|---|
| JP | 2000-208698 | 7/2000 |
| KR | 2001-0046110 | 6/2001 |
| KR | 20030045696 | 6/2003 |

OTHER PUBLICATIONS

English language abstract of the Japanese Publication No. 2000-208698.
English language abstract of the Korean Publication No. 2001-0046110.

* cited by examiner

*Primary Examiner*—Nitin Parekh
(74) *Attorney, Agent, or Firm*—Marger Johnson & McCollom, P.C.

(57) ABSTRACT

Embodiments of the invention include a stacked board-on-chip (BOC) package having a mirroring structure and a dual inline memory module (DIMM) on which the stacked BOC package is mounted. A bottom surface of a first semiconductor chip faces a bottom surface of a second semiconductor chip. An interposer electrically connects first and second packages, respectively comprising the first and second semiconductor chips, to each other. The DIMM is obtained by electrically connecting BOC packages to each other on upper and lower substrates of a printed circuit board. Since a height of the stacked BOC packages is greater than a height of a conventional stacked BOC package, the DIMM has a minimum stub length and an optimal topology. Hence, the DIMM can have a signal with excellent fidelity by reducing a load upon a signal line, and installation or wiring of components within the DIMM 300 requires less effort.

26 Claims, 4 Drawing Sheets

STACKED BOARD-ON-CHIP PACKAGE HAVING MIRRORING STRUCTURE AND DUAL INLINE MEMORY MODULE ON WHICH THE STACKED BOARD-ON-CHIP PACKAGES ARE MOUNTED

BACKGROUND OF THE INVENTION

This application claims the benefit of Korean Patent Application No. 10-2004-0072471, filed on Sep. 10, 2004, in the Korean Intellectual Property Office, the disclosure of which is incorporated herein in its entirety by reference.

1. Field of the Invention

The present invention relates to a semiconductor package, and more particularly, to a stacked board-on-chip (BOC) package having a mirroring structure and a dual inline memory module (DIMM) on which the stacked BOC packages are mounted.

2. Description of the Related Art

The trend in the semiconductor industry is to make semiconductor products compact, thin, light, highly integrated, and highly densified. This trend is also applied to dual inline memory modules (hereinafter, referred to as DIMMs) on each of which semiconductor memory devices are mounted. Board-on-chip (BOC) packages are well known and used for, for example, high-speed dynamic random access memory (DRAM) or the like. Stacked BOC packages have been recognized as convenient and suitable for constructing a high-speed, high-capacity DIMM.

FIG. 1 illustrates a conventional stacked BOC package 100. In the conventional stacked BOC package 100, a first substrate 110 having a cavity 113 in the center is attached to a first semiconductor chip 111, and contact pads 112 of the first semiconductor chip 111 are bonded to electrode pads 115 of the first substrate 110 via a wire 114. Similarly, electrode pads 125 of a second substrate 120 are bonded to contact pads 122 of a second semiconductor chip 121 via a wire 124. The electrode pads 115 of the first substrate 110 are connected to electrode pads 126 on an upper surface of the second substrate 120 via solder bumps 130. The electrode pads 126 on the upper surface of the second substrate 120 are connected to the electrode pads 125 on a lower surface of the second substrate 120 through via holes 127, which are filled with metal. The electrode pads 125 on the lower surface of the second substrate 120 are attached to solder bolls 140.

In the conventional stacked BOC package 100 signal line load increases with an increase of a package parasitic component caused by the stacked structure. When DIMMs are constructed with a conventional stacked BOC package 100, signal fidelity cannot be ensured because of the increased load of the signal line. The height of the solder bumps 130 restricts installation or wiring of components in the DIMM. Hence, it is not easy to apply an optimal topology to the DIMM. The DIMM stub is elongated due to the solder bumps 130, so a signal transmitted to a corresponding solder bump 130 is reflected, thus reducing signal fidelity.

In addition, when the conventional stacked BOC package 100 is used to construct a DIMM, a separate stacked BOC package must be manufactured so that pin arrangements on both surfaces of the DIMM are mirrored by each other. Developing an extra package increases costs.

There remains a need for a stacked BOC package having a ball pad structure in which mirroring is achieved and a DIMM with a short stub that results from mounting the stacked BOC package thereon.

SUMMARY OF THE INVENTION

Embodiments of the present invention provide a stacked board-on-chip (BOC) package having a mirroring structure.

Embodiments of the present invention also provide a dual inline memory module (DIMM).

According to an aspect of the present invention, a stacked board-on-chip package includes first and second packages, an interposer, and solder balls. The first package includes a first semiconductor chip installed on a first substrate. First electrode pads connected to first contact pads of the first semiconductor chip are connected to first via holes that penetrate the first substrate and are filled with metal. The second package includes a second semiconductor chip installed on a second substrate and is disposed so that a bottom of the second semiconductor chip faces a bottom surface of the first semiconductor chip. Second electrode pads connected to second contact pads of the second semiconductor chip are connected to second via holes that penetrate the second substrate and are filled with the metal. The interposer connects the first via holes to the second via holes. The solder balls are connected to the first electrode pads of the first package or the second electrode pads of the second package.

According to another aspect of the present invention, a stacked board-on-chip package includes first and second packages, first and second interposers, a heat spread plate, and solder balls. The first package includes a first semiconductor chip installed on a first substrate. First electrode pads connected to first contact pads of the first semiconductor chip are connected to first via holes that penetrate the first substrate and are filled with metal. The first interposer includes a first conductive plug connected to the first via holes. The second package includes a second semiconductor chip installed on a second substrate and is disposed so that a bottom surface of the second semiconductor chip faces a bottom surface of the first semiconductor chip. Second electrode pads connected to second contact pads of the second semiconductor chip are connected to second via holes that penetrate the second substrate and are filled with the metal. The second interposer includes a second conductive plug connected to the second via holes. The heat spread plate is interposed between the first and second interposers, electrically connects the first and second conductive plugs to each other via third via holes filled with metal, and transmits heat away from the first and second semiconductor chips. The solder balls are connected to the first electrode pads of the first package or the second electrode pads of the second package.

According to another aspect of the present invention, there is provided a dual inline memory module on which each of the above-described stacked board-on-chip packages is mounted. The dual inline memory module includes a printed circuit board, a bottom type stacked board-on-chip package, and a top type stacked board-on-chip package. In the bottom type stacked board-on-chip package, the solder balls are connected to the second electrode pads of the stacked board-on-chip package. In the top type stacked board-on-chip package, the solder balls are connected to the first electrode pads of the stacked board-on-chip package. The bottom type stacked board-on-chip package and the top type stacked board-on-chip package are installed on upper and lower surfaces of the printed circuit board, respectively, and electrically connected to each other.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
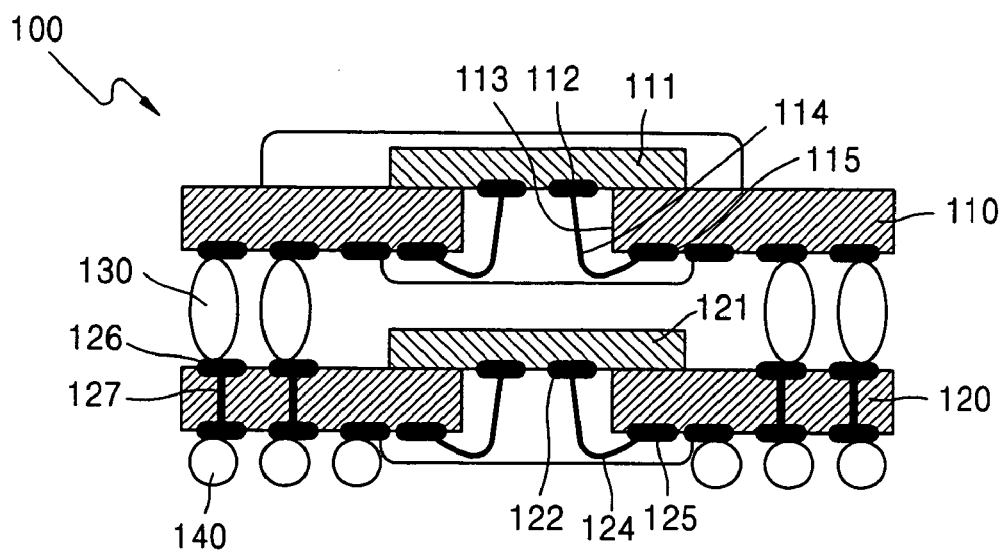
FIG. 1 illustrates a conventional stacked board-on-chip (BOC) package.

The attached drawings illustrating preferred embodiments of the present invention are referred to in order to gain a better understanding of the present invention, the merits thereof, and the objectives accomplished thereby.

Hereinafter, the present invention will be described in detail by explaining preferred embodiments of the invention with reference to the attached drawings. Like reference numerals in the drawings denote like elements.

Figure 2:
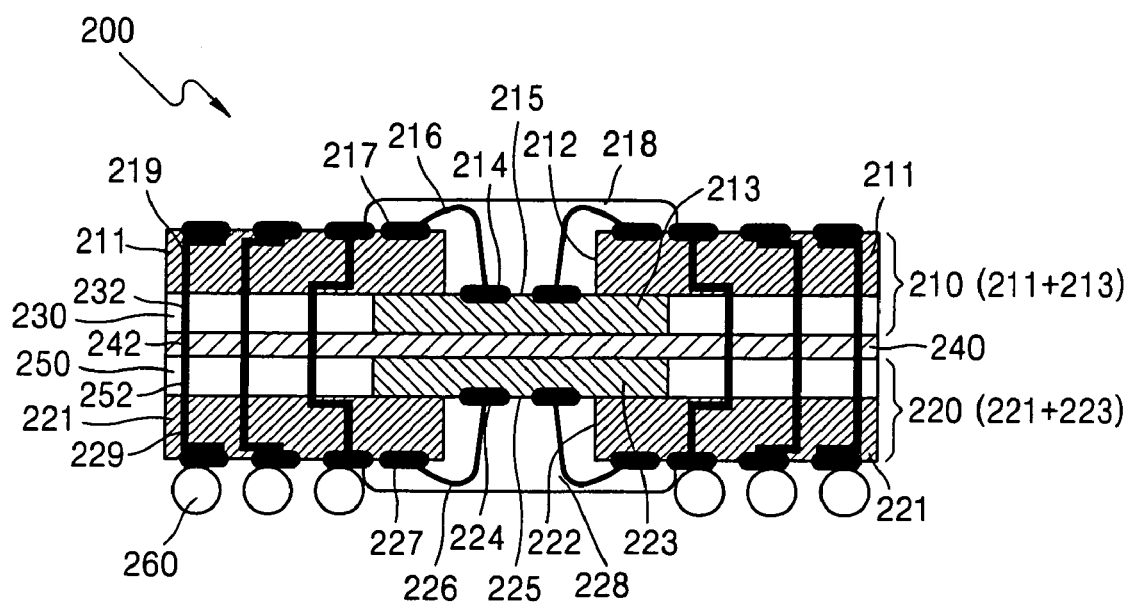
FIG. 2 illustrates a stacked BOC package according to an exemplary embodiment of the present invention.

FIG. 2 illustrates a stacked board-on-chip (BOC) package 200 having a mirroring structure, according to an exemplary embodiment of the present invention. Referring to FIG. 2, the stacked BOC package 200 is obtained by sequentially stacking a first package 210, a first interposer 230, a heat spread plate 240, a second interposer 250, and a second package 220. As will be described, each of the first and second interposers 230 and 250 has a structure that permits the first and second packages 210 and 220 to be electrically connected to each other. The structure of the interposers 230, 250 will be described in detail with reference to FIGS. 3 and 4.

First, in FIG. 2, the heat spread plate 240 transmits heat away from first and second semiconductor chips 213 and 223. The heat spread plate 240 may be made of a nickel film, an iron film, an aluminum film, or a metal film which is formed by chemical vapor deposition (CVD). Alternatively, the heat spread plate 240 may be a composite film including one of the nickel film, the iron film, the aluminum film, and the CVDed metal film or an alloy film including two or more of nickel, iron, and aluminum. The heat spread plate 240 may be formed of any material that is preferably adhesive and has good heat conductivity. Although the heat spread plate 240 is interposed between the first and second packages 210 and 220 in the present embodiment, the first and second packages 210 and 220 may be directly stacked one on another without the heat spread plate 240 therebetween.

The first package 210 includes a first substrate 211 having a first cavity 212, and the first semiconductor chip 213 having a first pad mounting surface 215 on which a plurality of first contact pads 214 are arranged. The first semiconductor chip 213 is attached and bonded to the first substrate 211 so that the first contact pads 214 of the first pad mounting surface 215 can exist within the first cavity 212. The first contact pads 214 are connected to first electrode pads 217 of the first substrate 211 via wires 216. A first encapsulation layer 218, which may be formed of epoxy resin, is provided to protect the wires 216 connected between the first contact pads 214 and the first electrode pads 217. Although not visible in the cross-section of FIG. 2, at least some of the first electrode pads 217 are connected to first via holes 219, which penetrate the first substrate 211 and are filled with metal.

The second package 220 includes a second substrate 221 having a second cavity 222, and a second semiconductor chip 223 having a second pad mounting surface 225 on which a plurality of second contact pads 224 are arranged. A second semiconductor chip 223 is attached and bonded to the second substrate 221 so that the second contact pads 224 of the second pad mounting surface 225 can exist within the second cavity 222. The second contact pads 224 are connected to second electrode pads 227 of the second substrate 221 via wires 226. A second encapsulation layer 228 formed of epoxy resin is provided to protect the wires 226. The second electrode pads 227 are connected to second via holes 229, which penetrate the second substrate 221 and are filled with metal.

A surface opposite to the first pad mounting surface 215 of the first semiconductor chip 213 and a surface opposite to the second pad mounting surface 225 of the second semiconductor chip 223 may be attached to upper and lower surfaces, respectively, of a heat spread plate 240. The first electrode pads 217 of the first package 210 and the second electrode pads 227 of the second package 220 are disposed to mirror each other centered on the heat spread plate 240. The first via holes 219 connected to the first electrode pads 217 are electrically connected to the second via holes 229 connected to the second electrode pads 227, via conductive plugs 232 and 252 within the first and second interposers 230 and 250 and third via holes 242, which penetrate the heat spread plate 240. The second electrode pads 227 are connected to solder balls 260. Hence, the solder balls 260 are disposed in a lower part of the stacked BOC package 200. Alternatively, the solder balls 260 may be disposed in an upper part of the stacked BOC package 200 to be connected to the first electrode pads 217.

Some of the first or second electrode pads 217 or 227 that are not connected to the solder balls 260 are covered with protective layers (not shown). The protective layers are usually photo solder resistors (PSRs) to prevent erosion of the first or second electrode pads 217 or 227.

Figure 3:
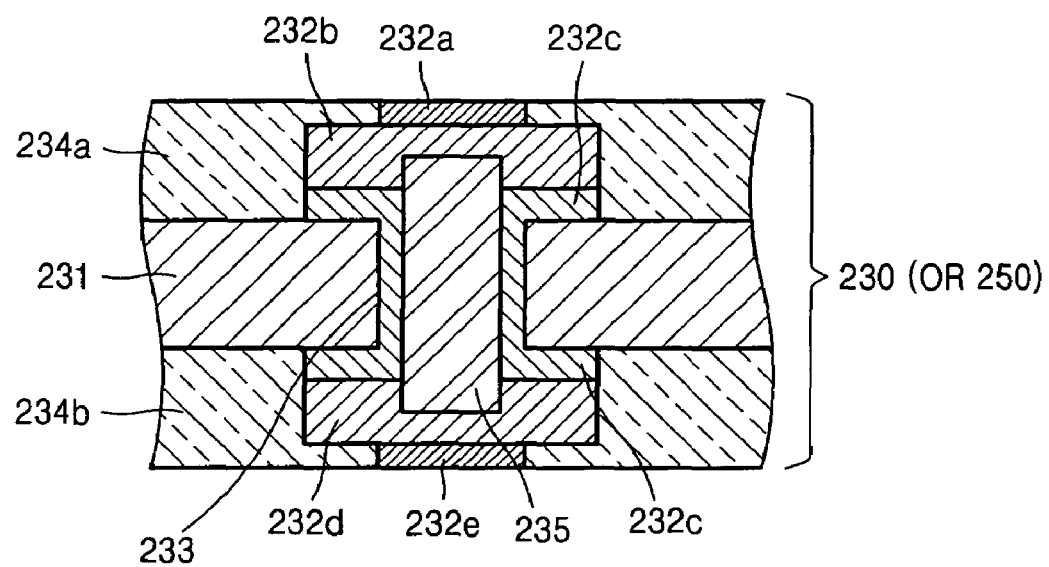
FIG. 3 is an enlarged view with portions broken away of the first or second interposer, as shown in FIG. 2.

FIG. 3 illustrates an example of the first or second interposer 230 or 250 of FIG. 2. Referring to FIG. 3, the first interposer 230, for example, includes a resin base 231 on both sides of which copper plates 232c are patterned and formed. The copper plates 232c are connected to each other by a via hole 233, which is formed of copper. Reference numerals 234a, 234b, and 235 are all insulative resist layers for insulative laminating. The copper films 232c are electrically connected to upper and lower bonding pattern layers 232b and 232d. Upper and lower pad electrodes 232a and 232e are exposed through openings of the insulative resist layers 234a and 234b and are connected to the bonding pattern layers 232b and 232d, respectively. The upper and lower pad electrodes 232a and 232e, the upper and lower bonding pattern layers 232b and 232d, and the copper plates 232c serve as the conductive plug 232 (see FIG. 2) of the first interposer 230.

Figure 4:
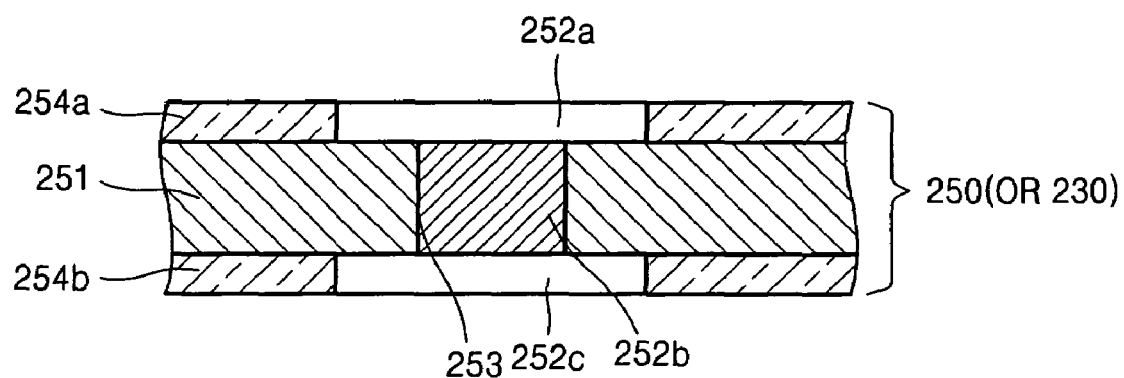
FIG. 4 illustrates another example of the first or second interposer of FIG. 2 in a view similar to FIG. 3.

FIG. 4 illustrates another example of the first or second interposer 230 or 250 of FIG. 2. Referring to FIG. 4, the second interposer 250, for example, includes a base 251 on which upper and lower pad electrodes 252a and 252c are formed. The upper and lower pad electrodes 252a and 252c electrically contact a plug 252b with which a via hole 253 of the base 251 is filled. Upper and lower insulative resist layers 254a and 254b cover upper and lower surfaces of the base 251 while almost surrounding the upper and lower pad electrodes 252a and 252c. The upper pad electrode 252a, the plug 252b, and the lower pad electrode 252c serve as the conductive plug 252 (see FIG. 2) of the second interposer 250.

Figure 5:
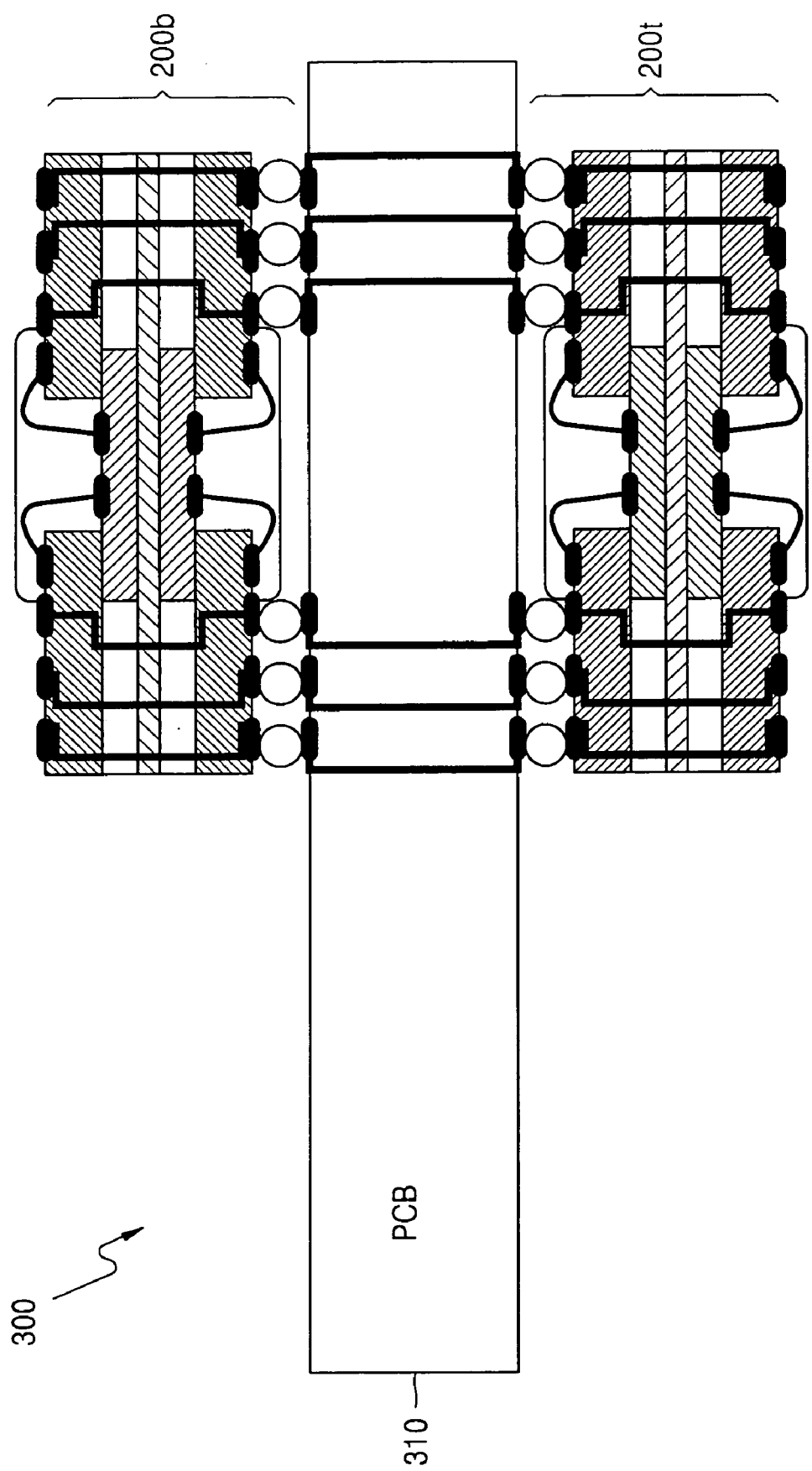
FIG. 5 illustrates a dual inline memory module (DIMM) made up of stacked BOC packages like those shown in FIG. 2.

A structure of a DIMM 300 using the stacked BOC package 200 is shown in FIG. 5. Referring to FIG. 5, the DIMM 300 is obtained by mounting a stacked BOC package having solder balls installed in its lower part (hereinafter, referred to as a bottom type stacked BOC package 200b) and a stacked BOC package having solder balls installed in its upper part (hereinafter, referred to as a top type stacked BOC package 200t) on upper and lower surfaces, respectively, of a printed circuit board (PCB) 310. Due to the installation of the bottom type stacked BOC package 200b and the top type stacked BOC package 200t on the upper and lower surfaces of the DIMM 300, pin arrangements on both sides of the DIMM 300 are mirrored by each other. Since a height of the bottom type stacked BOC package 200b or the top type stacked BOC package 200t is greater than a height of the conventional stacked BOC package 100, the DIMM 300 has a minimum stub length and an optimal topology. Hence, the DIMM 300 can have a signal with excellent fidelity by reducing a load upon a signal line, and installation or wiring of components within the DIMM 300 is easy.

Figure 6:
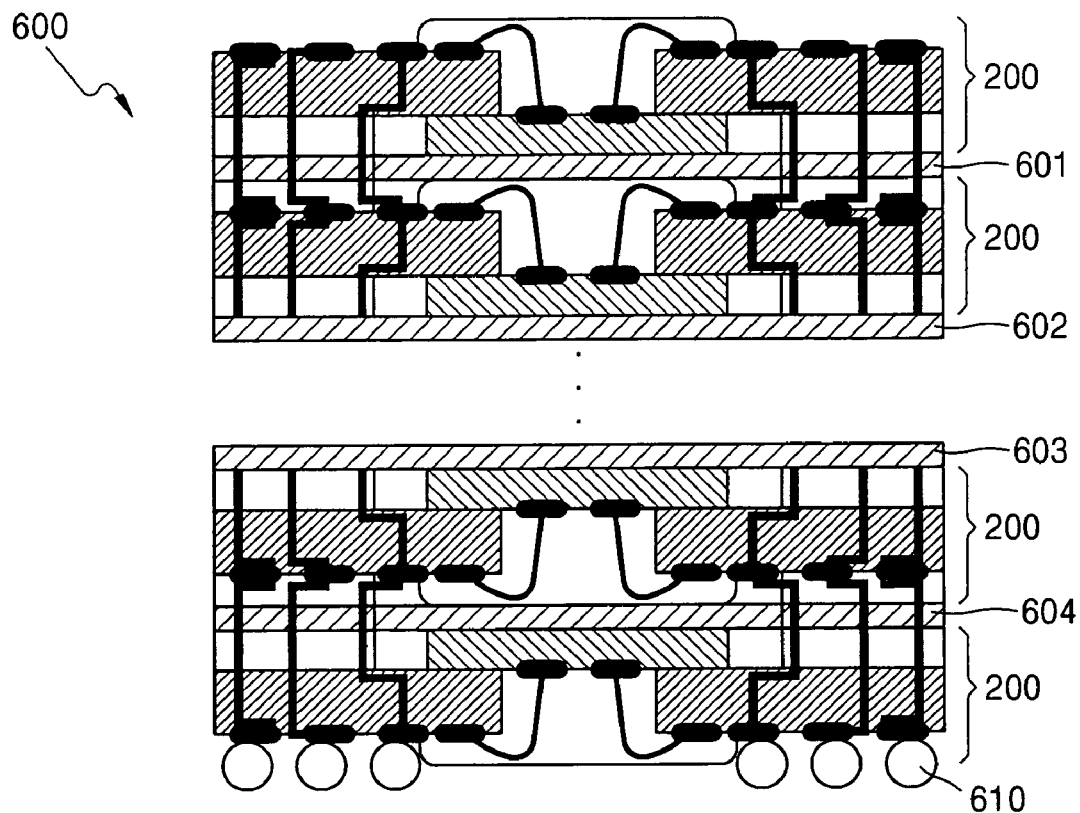
FIG. 6 illustrates a multi-stacked BOC package according to another exemplary embodiment of the present invention.

FIG. 6 illustrates a multi-stacked BOC package 600 in which three or more stacked BOC packages 200 are stacked, according to another exemplary embodiment of the present invention. Referring to FIG. 6, the multi-stacked BOC package 600 is obtained by stacking a plurality of stacked BOC packages 200 while interposing heat spread plates 601, 602, 603, and 604 therebetween. Electrode pads of a stacked BOC package 200 located at the bottommost position are connected to solder balls 610. As described in FIG. 2, the heat spread plates 601, 602, 603, and 604 are optional, and need not be used in the multi-stacked BOC package 600.

Figure 7:
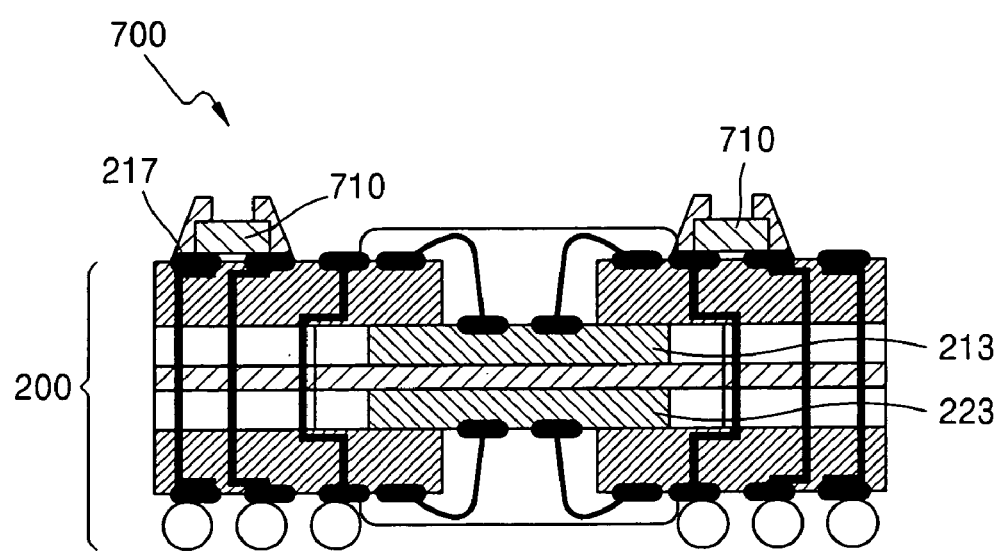
FIG. 7 illustrates a stacked BOC package according to still another exemplary embodiment of the present invention.

FIG. 7 illustrates a stacked BOC package 700 according to still another exemplary embodiment of the present invention. The stacked BOC package 700 is obtained by adding discrete devices 710 to the stacked BOC package 200 of FIG. 2. Each of the discrete devices 710 is connected between adjacent first electrode pads 217. The discrete devices 710 may be each comprised of resistors, decoupling capacitors, or the like to improve electrical characteristics of the first and second semiconductor chips 213 and 223 or electrical characteristics of a DIMM on which the stacked BOC package 700 is to be installed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A stacked board-on-chip package comprising:
   a first package including a first semiconductor chip installed on a first substrate, wherein first electrode pads connected to first contact pads of the first semiconductor chip are connected to first via holes that penetrate the first substrate and are filled with metal;
   a second package including a second semiconductor chip installed on a second substrate, disposed so that a bottom surface of the second semiconductor chip faces a bottom surface of the first semiconductor chip, wherein second electrode pads connected to second contact pads of the second semiconductor chip are connected to second via holes that penetrate the second substrate and are filled with the metal;
   a first surface formed on the first semiconductor chip that contains the first contact pads, the first surface being mounted on a lower surface of the first substrate;
   a second surface formed on the second semiconductor chip that contains the second contact pads, the second surface being mounted on an upper surface of the second substrate;
   an interposer connecting the first via holes to the second via holes; and
   solder balls connected to the first electrode pads of the first package or the second electrode pads of the second package.
2. The stacked board-on-chip package of claim 1, wherein the first package comprises:
   the first substrate having a first cavity;
   the first semiconductor chip having the first pad mounting surface on which the plurality of first contact pads are arranged, the first semiconductor chip bonded to the first substrate so that the first pad mounting surface is located within the first cavity;
   the first electrode pads wire-bonded to the first contact pads; and
   the first via holes connected to the first electrode pads.
3. The stacked board-on-chip package of claim 1, wherein the second package comprises:
   the second substrate having a second cavity;
   the second semiconductor chip having the second pad mounting surface on which the plurality of second contact pads are arranged, the second semiconductor chip bonded to the second substrate so that the second pad mounting surface is located within the second cavity;
   the second electrode pads wire-bonded to the second contact pads; and
   the second via holes connected to the second electrode pads.
4. The stacked board-on-chip package of claim 1, wherein the interposer comprises:
   a base;
   a copper plate formed on a lateral side of a via hole within the base;
   a first insulative resist layer with which the via hole within the base is filled, the layer contacting the copper plate;
   upper and lower bonding pattern layers disposed on upper and lower surfaces of the base and electrically connected to the copper plate;
   second insulative resist layers surrounding the upper and lower bonding pattern layers formed on the upper and lower surfaces of the base; and
   upper and lower pad electrodes connected to the upper and lower bonding pattern layers through openings of the second insulative resist layers and to the first and second via holes of the first and second packages.
5. The stacked board-on-chip package of claim 1, wherein the interposer comprises:
   a base;
   a plug with which a via hole within the base is filled;

upper and lower pad electrodes electrically contacting the plug; and upper and lower insulative resist layers covering upper and lower surfaces of the base while surrounding the upper and lower pad electrodes.

6. The stacked board-on-chip package of claim 1, further comprising a heat spread plate interposed between the first and second packages.

7. The stacked board-on-chip package of claim 6, wherein the heat spread plate is a film selected from the group consisting of a nickel film, an iron film, an aluminum film, and a metal film which is formed by chemical vapor deposition.

8. The stacked board-on-chip package of claim 6, wherein the heat spread plate is either a composite film including a film selected among a nickel film, an iron film, an aluminum film, and a metal film formed by chemical vapor deposition or an alloy film including two or more of the group consisting of nickel, iron, and aluminum.

9. The stacked board-on-chip package of claim 6, wherein the heat spread plate is formed of a material that is adhesive and has excellent heat-conductivity.

10. The stacked board-on-chip package of claim 1, wherein the first and second semiconductor chips are identical.

11. The stacked board-on-chip package of claim 1, wherein the first and second semiconductor chips are different.

12. The stacked board-on-chip package of claim 1, wherein some of the first and second electrode pads that are not connected to the solder balls are covered with a protective layer.

13. The stacked board-on-chip package of claim 12, wherein the protective layer is formed of a photo solder resist.

14. A stacked board-on-chip package comprising:

a first package including a first semiconductor chip installed on a first substrate, wherein first electrode pads connected to first contact pads of the first semiconductor chip are connected to first via holes that penetrate the first substrate and are filled with metal;

a first interposer including a first conductive plug connected to the first via holes;

a second package including a second semiconductor chip installed on a second substrate, disposed so that a bottom surface of the second semiconductor chip faces a bottom surface of the first semiconductor chip, wherein second electrode pads connected to second contact pads of the second semiconductor chip are connected to second via holes that penetrate the second substrate and are filled with the metal;

a second interposer including a second conductive plug connected to the second via holes;

a heat spread plate interposed between the first and second interposers, electrically connecting the first and second conductive plugs to each other via third via holes filled with metal, the heat spread plate adapted to transmit heat away from the first and second semiconductor chips; and solder balls connected to the first electrode pads of the first package or the second electrode pads of the second package.

15. The stacked board-on-chip package of claim 14, wherein the first package comprises:

the first substrate having a first cavity;

the first semiconductor chip having a first pad mounting surface on which the of first contact pads are arranged, the first semiconductor chip bonded to the first substrate so that the first pad mounting surface is located within the first cavity;

the first electrode pads wire-bonded to the first contact pads; and the first via holes connected to the first electrode pads.

16. The stacked board-on-chip package of claim 14, wherein the second package comprises:

the second substrate having a second cavity;

the second semiconductor chip having a second pad mounting surface on which the of second contact pads are arranged, the second semiconductor chip bonded to the second substrate so that the second pad mounting surface is located within the second cavity;

the second electrode pads wire-bonded to the second contact pads; and the second via holes connected to the second electrode pads.

17. The stacked board-on-chip package of claim 14, wherein each of the first and second interposers comprises:

a base;

a copper plate formed on a lateral side of a via hole within the base;

a first insulative resist layer with which the via hole within the base is filled, while contacting the copper plate;

upper and lower bonding pattern layers disposed on upper and lower surfaces of the base and electrically connected to the copper plate;

second insulative resist layers surrounding the upper and lower bonding pattern layers formed on the upper and lower surfaces of the base; and upper and lower pad electrodes connected to the upper and lower bonding pattern layers through openings of the second insulative resist layers and to the third via holes of the heat spread plate.

18. The stacked board-on-chip package of claim 14, wherein each of the first and second interposers comprises:

a base;

a plug with which a via hole within the base is filled;

upper and lower pad electrodes electrically contacting the plug; and upper and lower insulative resist layers covering upper and lower surfaces of the base while surrounding the upper and lower pad electrodes.

19. The stacked board-on-chip package of claim 14, wherein the heat spread plate is formed of a material that is adhesive and has excellent heat-conductivity.

20. The stacked board-on-chip package of claim 14, wherein the first and second semiconductor chips are identical.

21. The stacked board-on-chip package of claim 14, wherein the first and second semiconductor chips are different.

22. The stacked board-on-chip package of claim 14, wherein some of the first and second electrode pads that are not connected to the solder balls are covered with a protective layer.

23. The stacked board-on-chip package of claim 22, wherein the protective layer is formed of a photo solder resist.

24. The stacked board-on-chip package of claim 14, wherein discrete devices are connected between adjacent first electrode pads or adjacent second electrode pads.

25. The stacked board-on-chip package of claim 24, wherein the discrete devices are each comprised of either resistors or decoupling capacitors.

26. A stacked board-on-chip package comprising:

a first package including a first semiconductor chip installed on a first substrate, wherein first electrode pads connected to first contact pads of the first semiconductor chip are connected to first via holes that penetrate the first substrate and are filled with metal;

a second package including a second semiconductor chip installed on a second substrate, disposed so that a bottom surface of the second semiconductor chip faces a bottom surface of the first semiconductor chip, wherein second electrode pads connected to second contact pads of the second semiconductor chip are connected to second via holes that penetrate the second substrate and are filled with the metal;

an interposer connecting the first via holes to the second via holes; and solder balls connected to the first electrode pads of the first package or the second electrode pads of the second package, wherein the interposer comprises:

a base;

a copper plate formed on a lateral side of a via hole within the base;

a first insulative resist layer with which the via hole within the base is filled, the layer contacting the copper plate;

upper and lower bonding pattern layers disposed on upper and lower surfaces of the base and electrically connected to the copper plate;

second insulative resist layers surrounding the upper and lower bonding pattern layers formed on the upper and lower surfaces of the base; and upper and lower pad electrodes connected to the upper and lower bonding pattern layers through openings of the second insulative resist layers and to the first and second via holes of the first and second packages.

* * * * *